(12) United States Patent
Agassi

(10) Patent No.: US 6,961,597 B1
(45) Date of Patent: Nov. 1, 2005

(54) STRIPS FOR IMPARTING LOW NONLINEARITY TO HIGH TEMPERATURE SUPERCONDUCTOR MICROWAVE FILTERS

(75) Inventor: Yehoshua Dan Agassi, Silver Spring, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 280 days.

(21) Appl. No.: 10/609,866

(22) Filed: Jul. 1, 2003

(51) Int. Cl.[7] .......................... H01B 12/00; H01F 6/00; H01L 39/00; H01P 1/00
(52) U.S. Cl. ..................... 505/230; 505/202; 505/210; 505/410; 505/430; 333/99 S
(58) Field of Search .............................. 505/202, 210, 505/230, 238, 410, 430, 701, 704, 822, 866; 333/99 S, 185

(56) References Cited

U.S. PATENT DOCUMENTS

| | | | | |
|---|---|---|---|---|
| 5,113,164 A | * | 5/1992 | De Wames et al. | 505/210 |
| 5,576,674 A | * | 11/1996 | Jachowski | 333/212 |
| 5,939,958 A | * | 8/1999 | Grounds et al. | 333/204 |
| 6,041,245 A | | 3/2000 | Mansour | |
| 6,094,588 A | | 7/2000 | Adam | |
| 6,212,404 B1 | | 4/2001 | Hershtig | |
| 6,366,096 B1 | | 4/2002 | Talanov et al. | |
| 6,438,394 B1 | * | 8/2002 | Zhang et al. | 505/210 |
| 6,463,308 B1 | | 10/2002 | Wikborg et al. | |
| 6,516,208 B1 | | 2/2003 | Eden | |
| 6,529,092 B2 | | 3/2003 | Fuke et al. | |
| 6,635,368 B1 | | 10/2003 | Agassi | |
| 6,638,895 B1 | * | 10/2003 | Karapetrov et al. | 505/320 |
| 2002/0130716 A1 | | 9/2002 | Larson et al. | |
| 2002/0130729 A1 | | 9/2002 | Larson et al. | |

OTHER PUBLICATIONS

D. Agassi et al., "New vortex state in the presence of a long Josephson junction," Physica C 319 (1999), pp. 1-12.*
D. Agassi et al., "Superconductor strip response to a normally incident magnetic field," Physica C 323 (1999), pp. 94-106.*
D. Agassi et al., "Single-vortex structure in a superconductor film and strip," Physica C 334 (2000), pp. 274-282.*

(Continued)

Primary Examiner—Colleen P. Cooke
(74) Attorney, Agent, or Firm—Howard Kaiser

(57) ABSTRACT

Based on its superconductive properties relating to "nonlineanty," a conventional HTS strip is divisible into three "domains," namely, a medial domain and two lateral domains. The nonlinearity associated with the conventional strip's medial domain is considerably greater than that which is associated with its lateral domains. Similarly divisible into a medial domain and two lateral domains, the present invention's HTS strip uniquely exploits these physical distinctions by causing more (e.g., most) of the current that it conducts to be conducted by its lateral domains. Various inventive designs accomplish this through narrowing or interruption/punctuation (e.g., via holes and/or trenches) or degradation, or some combination thereof, of the medial domain. By thus "re-proportioning" current conduction as compared with a conventional strip, an inventive strip succeeds in "re-proportioning" the associated nonlinearities. Consequently, the total nonlinearity associated with an inventive strip is significantly lower than that which is associated with a conventional strip.

20 Claims, 8 Drawing Sheets

OTHER PUBLICATIONS

D. Agassi et al., "Superconductor strip geometrical barrier in the presence of a weak applied field," Physica C 334 (2000), pp. 259-273.*

D. Agassi, "Intrinsic 1/f noise in a superconductor strip," *Physica C: Superconductivity*, vol. 371, issue 1, pp. 34-44 (Jun. 2002; available online Dec. 9, 2001).

D.E. Oates et al., "Nonlinear microwave surface impedance of YBCO films: latest results and present understanding," *Physica C: Superconductivity*, vol. 372-376, part 1, pp. 462-468 (Aug. 2002; available online Apr. 9, 2002).

* cited by examiner

STRIPS FOR IMPARTING LOW NONLINEARITY TO HIGH TEMPERATURE SUPERCONDUCTOR MICROWAVE FILTERS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to high temperature superconductors, more particularly to the use thereof in filters suitable for electronic applications such as those involving radar or communications.

High temperature superconductor (abbreviated "HTS") filters have already seen some commercial success in the capacity of operation in or with receiver antennae in cellular phone base stations. Nevertheless, the potential exists for expanded use of HTS filters. The main impediment to extension of HTS filters to emitter antennae applications is the observed "surface impedance nonlinearity" that is associated with the dependence of the HTS filters on the microwave field power level. This nonlinearity occurrence generates undesirable "intermodulation" products that are particularly detrimental to radar and secure communication applications. Recent work asserts the origin of this phenomenon as an intrinsic property of HTS, and hence concludes that this phenomenon cannot be eliminated.

At the front end of any microwave receiver-antenna is a filter that cuts off ("excises") all frequencies outside a predetermined frequency window ("bandpass") to prevent the totality of airways signals from overwhelming the device. The operational principle of such filters may be described in terms of a "resonator cavity," according to which the cavity is designed to resonate at a predetermined frequency window ("bypass band"), where transmission is at its maximum, while at all other frequencies transmission is strongly suppressed. In practice, such a microwave cavity is realized by a series of inductively coupled narrow copper "strips" ("poles") that can be arranged in a variety of configurations. For pertinent disclosure, see, e.g, Zhi-Yuan Shen, *High-Temperature Superconducting Microwave Circuits*, Artech House, Boston, May 1994, incorporated herein by reference, esp. Chapter Four. The terms "strip" and "pole" have been used interchangeably in the technical realm of HTS-based filters.

Shen at page 116 illustrates one such geometry (Shen, FIG. 4.14) and its corresponding bypass band (Shen, FIG. 4.15). More specifically, Shen states that his FIG. 4.14 shows "[a]four-pole superconductive microstrip filter layout. The substrate is $LaAlO_3$." Shen states that his FIG. 4.15 shows "[m]easured transmission response at 77K of a filter fabricated with a postannealed YbaCuO on 425-$\mu$m-thick substrate." The box-like bypass band is roughly comprised of the sum of slightly shifted gaussian-shaped bypass bands from each of the poles. The more poles, the closer the bypass band shape is to an ideal "box" shape. On the other hand, increase in the number of poles is associated with increase in losses, which in turn degrades the bypass band sharpness (e.g., introduces "skirts"). The latter characteristics determine the degree to which signals outside the nominal bypass band are mixed in.

The same kind of unwanted mixing is also generated whenever the poles' surface impedance is nonlinear, i.e., dependent on the microwave signal power level. The magnitude of these undesirable admixtures, known as "intermodulation products," is a key performance measure of a filter. For the common copper-based filters, in which copper is to a high degree a linear material, a popular approach to minimization of intermodulation products is to increase the number of poles. This approach constitutes a tradeoff between the bypass band sharpness on the one hand, and an increase in the device volume and its noise level on the other hand. The latter effects represent disadvantages that are particularly important for military and civilian applications in which size and bypass band sharpness are key. Examples of such applications are those involving antennae arrays in radar, as well those involving compact, sensitive antennae.

The discovery in 1986 of the HTS family of materials led to the suggestion of replacing the copper strips in microwave filters with HTS strips. The distinct advantages of HTS-based filters are their significantly lower losses (which are, depending on temperature, by about two to three orders of magnitude) and their relatively small size. Due to these and other advantages (such as affordability, reliability and low maintenance), as well as due to the advent of maintenance-free small-volume closed-cycle coolers, HTS-based filters have become a commercial reality. Notable among the companies involved in this line of business are Superconductor Technologies Inc. (STI) of Santa Barbara, Calif., and Conductus, Inc. of Sunnyvale, Calif. STI recently completed a merger with Conductus, and can be contacted at 460 Ward Drive, Santa Barbara, Calif., 93111. The current deployment of HTS-based filter units in over a thousand commercial wireless base-stations represents the first large scale application of such devices. See pertinent disclosure by B. Willemsen, "HTS Technology for Commercial Wireless Applications," *Journal of Superconductivity* (in press, 2003), incorporated herein by reference. Moreover, the sharp bandpass and low losses characterizing HTS-based filters are expected to become increasingly influential in the increasingly crowded civilian cellular phones spectrum. HTS-based filters have military implications as well. For instance, the United States Navy is interested in extending the applicability of HTS-based filters to higher power emit antennae, such as may be used for radar.

The technological progress in HTS-based filter utilization is hampered, however, by the observed HTS surface impedance nonlinearity, i.e., its dependence on the microwave field power level. See pertinent disclosure by the following papers incorporated herein by reference: P. P. Nguyen, D. E. Oates, G. Dresselhaus, M. S. Dresselhaus and A. C. Anderson, *Phys. Rev. B* 51, 6686 (1995); Y. M. Habib, C. J. Lehner, D. E. Oates, L. R. Vale, R. H. Ono, G. Dresselhaus and M. S. Dresselhaus, *Phys, Rev. B* 57 13833 (1998). Surface impedance nonlinearity has been observed in low temperature superconductor (abbreviated "LTS") films such as Niobium Nitrate (NbN). See pertinent disclosure by the following papers, incorporated herein by reference: P. P. Nguyen, D. E. Oates, G. Dresselhaus, M. S. Dresselhaus and A. C. Anderson, *Phys. Rev. B* 57, 6686 (1995); Y. M. Habib, C. J. Lehner, D. E. Oates, L. R. Vale, R. H. Ono, G. Dresselhaus and M. S. Dresselhaus, *Phys, Rev. B* 57, 13833 (1998). Surface impedance nonlinearity has also been observed in HTS films of YBCO and BSCCO and TBCCO (the $Bi_2Sr_2CACuO$ and $Tl_2Ba_2CaCuO$ groups). See pertinent disclosure by the following papers, incorporated herein by reference: J. H. Claasen, J. C. Booth, J. A. Beall, L. R. Vale, D. A. Rudman and R. H. Ono, *Supercond. Sci. Technol.* 12, 714 (1999); J. C. Booth, L. R. Vale, R. H. Ono and J. H. Claasen, *Supercond. Sci. Technol.* 12, 711 (1999); H.

Claasen, J. C. Booth, J. A. Beall, D. A. Rudman, L. R. Vale and R. H. Ono, *App. Phys. Lett.* 74, 4023 (1999); J. C. Booth, J. A. Beall, D. A. Rudman, L. R. Vale and R. H. Ono, *Journal App. Phys.* 86, 1020 (1999). As of yet there is no consensus regarding the origin of surface impedance nonlinearity. See pertinent disclosure by D. E. Oates, M. H. Hein, P. J. Hirst, R. G. Humphreys, G. Koren and E. Polturak, "Nonlinear Microwave Surface Impedance of YBCO Films: Latest Results and Present Understanding," *Physica C* (Superconductivity), volumes 372–376, part 1, pages 462–468 (1 Aug. 2002; available online 9 Apr. 2002), incorporated herein by reference.

Recent YBCO data provides clear evidence that nonlinearity is observed in high quality films and is enhanced by factors such as magnetic/non-magnetic impurity doping (Zn, Ni) and oxygen underdoping. See pertinent disclosure by the aforementioned D. E. Oates et al., *Physica C* 372–376, 462 (2002). It has been suggested that vortex motion in large-angle grain and twin boundaries, which are ubiquitous in HTS, are the root cause for the nonlinearity phenomenon. See pertinent disclosure by the following papers, incorporated herein by reference: M. Coffey and J. R. Clem, *Phys. Rev. B* 48, 342 (1993); M. Benkraouda and J. R. Clem, *Phys. Rev.* 53, 5716 (1996); J. McDonald, J. R. Clem and D. E. Oates, *Phys. Rev. B* 55, 11823 (1997); J. Halbritter, *Journal of Superconductivity* 10 91 (1997). This attribution to vortex motion is motivated by the observation that such defects act as Josephson junctions; since vortex motion in a Josephson junction is nonlinear, it is reasoned, the ensuing surface impedance is nonlinear as well. While this mechanism is certainly at work it has proved to be quantitatively unable to account for the observed nonlinearity at elevated power levels. See pertinent disclosure by the aforementioned D. E. Oates et al., *Physica C* 372–376, 462 (2002). See pertinent disclosure also by H. Xin, D. E. Oates, A. C. Anderson, R. L. Slattery, G. Dresselhaus and M. S. Dresselhaus, *IEEE Trans. Microwave Theory and Techniques*, 48, 1221 (2000), incorporated herein by reference.

A competing proposition is that the nonlinearity is intrinsic to the highly correlated electron state (the condensate state) that underlies the superconductivity phenomenon. This proposition ("intrinsic nonlinearity") is consistent with the observed nonlinearities in LTS and HTS that are qualitatively different, and with the observed nonexistent frequency dependence of the nonlinearity effect. See pertinent disclose by the aforementioned D. E. Oates et al., *Physica C* 372–376, 462 (2002). This proposition was further corroborated by calculations that quantitatively explain recent data of high quality, optimally oxygenated HTS sample. See D. Agassi and D. E. Oates, "Nonlinear Surface Reactance of a Superconductor Strip," *Journal of Superconductivity*, Vol. 16 No. 5, pp. 905–961 (October 2003).

Encased YBCO ($YBa_2Cu_3O_{7-\delta}$) strips (typically 300 nm thick, $100\mu$ wide and on the order of several centimeters long) exhibit, at elevated power levels, an amount of nonlinearity sufficiently large to introduce intermodulation products to a degree that is deleterious for radar applications. If HTS emit-filters are to become a reality, then, nonlinear microwave response must be controlled and reduced. It is thus essential that the nonlinear surface impedance of HTS filters be reduced at microwave frequencies, in order to enhance the performance of HTS filters and extend their operational range to power applications such as those involving transmitting antennae and radar.

The following United States patent documents, incorporated herein by reference, pertain to superconductivity and superconductor devices, especially such involving high-temperature superconducting materials: Fuke et al. U.S. Pat. No. 6,529,092 B2 issued 4 Mar. 2003; Eden U.S. Pat. No. 6,516,208 B1 issued 4 Feb. 2003; Wikborg et al. U.S. Pat. No. 6,463,308 B1 issued 8 Oct. 2002; Talanov et al. U.S. Pat. No. 6,366,096 B1 issued 2 Apr. 2002; Hershtig U.S. Pat. No. 6,212,404 issued 3 Apr. 2001; Adam U.S. Pat. No. 6,094,588 issued 25 Jul. 2000; Mansour U.S. Pat. No. 6,041,245 issued 21 Mar. 2000; Larson et al. U.S. Patent Application Publication 2002/0130729 A1 published 19 Sep. 2002; Larson et al. U.S. Patent Application Publication 2002/0130716 A1 published 19 Sep. 2002.

SUMMARY OF THE INVENTION

In view of the foregoing, it is an object of the present invention to provide a methodology for lowering the nonlinear surface impedance of high temperature superconducting (HTS) filters at microwave frequencies.

In accordance with many embodiments of the present invention, a superconductor strip (e.g., a high temperature superconductor strip), suitable for situation upon a substrate, comprises superconductor material (e.g., high temperature superconductor material). The inventive superconductor strip has three domains, viz., a pair of lateral domains and a medial domain (intermediate the lateral domains). When the inventive superconductor strip conducts electrical current: the amount of current that is conducted by the inventive superconductor strip is the sum of the current that is conducted by its medial domain and the current that is conducted by its lateral domains; and, more than fifty percent of the current that is conducted by the inventive superconductor strip is conducted by its lateral domains (equivalently expressed, less than fifty percent of the current that is conducted by the inventive superconductor strip is conducted by its medial domain). According to typical inventive embodiments, the superconductor strip is characterized by a strip width, the medial domain is characterized by a medial width, and each lateral domain is characterized by a lateral width. The strip width is the sum of the medial width and the lateral widths. Each lateral width approximately equals the penetration depth of the inventive HTS strip.

Generally according to inventive practice, the inventive superconductor strip has associated therewith a strip nonlinearity, the medial domain has associated therewith a medial nonlinearity, and the lateral domains have associated therewith a lateral nonlinearity. The medial nonlinearity is greater than the lateral nonlinearity. The strip nonlinearity is the sum of the medial nonlinearity and the lateral nonlinearity. The strip nonlinearity varies in accordance with the proportions, with respect to the conducting of the current by the strip, of the conducting by the medial domain and the conducting by the lateral domain. According to many inventive embodiments, the medial domain is attributed with at least one element that reduces the conductivity of the medial domain as compared with what the conductivity of the medial domain would be in the absence of such at least one element. The element or elements is or are the following: (i) the presence of plural apertures in the medial domain; and/or, (ii) the presence of plural depressions in the medial domain; and/or, (iii) the presence of insulating oxide material in the medial domain.

The present invention also provides a method for reducing the nonlinearity associated with a superconductor strip (which is at least substantially composed of a superconductor material) placed on a substrate. Many embodiments of the inventive method are for reducing the nonlinearity associated with a high temperature superconductor strip (which is at least substantially composed of a high temperature superconductor material). The inventive method comprises: identifying two longitudinal lateral domains and one longitudinal medial domain (located between the lateral domains) into which the superconductor strip is widthwise divided, each lateral domain having a width approximately equal to the penetration depth of the superconductor strip; and, modifying the medial domain so that the conductivity of the medial domain decreases, the conductivity of the lateral domains proportionately increasing relative to the overall conductivity of the superconductor strip, the overall nonlinearity of the superconductor strip commensurately decreasing. Generally according to the inventive method, the modifying of the medial domain results in the conductivity of the lateral domains being greater than one-half of the overall conductivity of the superconductor strip. According to typical inventive embodiments, the modifying of the medial domain includes performing at least one of the following: (i) providing plural apertures in said medial domain; and/or, (ii) providing plural depressions in said medial domain; and/or, (iii) degrading said medial domain. Usually, the degrading of the medial domain includes heating the medial domain so as to deoxygenate the medial domain, the degrading resulting in the medial domain being at least substantially composed of a dielectric oxide material.

The present invention further provides a combination including a substrate and at least one conductive strip disposed on the substrate. Each conductive strip includes a superconductive material (e.g., a high temperature superconductive material) and is characterized by two lateral domains and a medial domain therebetween. The lateral domains of a conductive strip at least substantially consist of superconductive material (e.g., a high temperature superconductive) material. Each lateral domain of a conductive strip has a width corresponding to the penetration depth the conductive strip. The lateral domains of a conductive strip conduct more than half of the electricity that is conducted by the conductive strip. In other words, the medial domain of a conductive strip conducts less than half of the electricity that is conducted by the conductive strip, since the total amount of electricity that is conducted by the conductive strip is the amount of electricity that is conducted by the conductive strip's medial domain plus the amount of electricity that is conducted by the strip's lateral domains; correspondingly, the total amount of nonlinearity that is associated with conduction by the conductive strip is the amount of nonlinearity that is associated with conduction by the conductive strip's median domain plus the amount of nonlinearity that is associated with conduction by the conductive strip's lateral domains. According to typically inventive practice, the conductive strip is a "thin film" variety of conductive strip. Generally preferred inventive embodiments include one or more conductive strips that are at least substantially made of high temperature superconductor material.

Nonlinearity results in unwanted intermodulation products that are harmful in contexts of radar and communication applications. The present inventor's scientific understanding is that nonlinearity is an inherent characteristic of HTS and therefore cannot be eliminated. The present invention features new strip (pole) geometries that represent unique modifications of old strip (pole) geometries, the present invention thus affording the benefits of substantial reductions in nonlinearities. The inventive implementation of novel strip geometries provides an effective strategy for approaching the ideal form of a compact linear sharp bypass band device. The present invention's strip geometries succeed in lowering or minimizing the nonlinear surface impedance of HTS filters at microwave frequencies, thereby enhancing their performance and extending their operational range to high power emission applications such as transmission antennae and radar.

The aforementioned D. Agassi and D. E. Oates, *Journal of Superconductivity*, Vol. 16 No. 5, pp. 905–961 discloses that the operative mechanisms for nonlinearity are qualitatively distinct at the two opposite borders or margins (i.e., the HTS strip's two outside extreme regions), as compared with the middle (i.e., the HTS strip's single inside region, located between the HTS strip's two extreme outside regions). The HTS strip's two bordering/marginal regions are synonymously referred to herein as the "lateral domains" or "near-edge domains" of the HTS strip. The HTS strip's middle/intermediate region, located between the HTS strip's two near-edge domains, is synonymously referred to herein as the "medial domain" or "midsection domain." Each near-edge domain is a region that is delimited by an edge and that covers a longitudinal portion of the HTS strip that is proximate or adjacent to the edge.

In the strip's midsection domain, intrinsic nonlinearity dominates. Since the midsection domain typically covers most of the strip width, good agreement with the nonlinearity data follows. The present invention avails itself of the distinction in mechanisms operating in these two domain types, viz., the HTS strip near-edge sections versus the HTS strip midsection. That is, there are two distinct types of nonlinearities in a strip: (i) the intrinsic nonlinearity that emanates from the strip midsection; and, (ii) the Lorentz-force nonlinearity that emanates from the strip near-edge sections due to the large current density and gradients at such locations. The strip's midsection type of nonlinearity is "large" (considerably larger) and is frequency-independent. In contrast, the strip's near-edge type of nonlinearity is "small" (considerably smaller), and decreases in accordance with $f^{-2}$, where f is the frequency. The present inventor believes that the intrinsic nonlinearity that is present in the strip's midsection may also be present, but to an as yet unknown extent, in the strip's near-edge sections (in addition to the Lorentz-force nonlinearity that is present in the strip's near-edge sections).

The present invention provides HTS strips that, for many applications, have superior performance as compared with conventional HTS strips. As compared with a conventional superconductor strip, the inventive superconductor strip's overall current conduction is decreased by decreasing the medial domain's current conduction while not changing the lateral edge domains' current conduction; in this manner, the respective current conductions, and hence the associated nonlinearities, are "re-proportioned" in favor of the lateral edge domains. According to frequent inventive practice, the majority portion (more than half) of the electricity is caused to be conducted via the two lateral ("near-edge") domains, while the minority portion (less than half) of the electricity is caused to be conducted via the medial ("midsection") domain. The present invention effects these ratios or proportions of conductibility (of the midsection domain relative to the edge domains in an HTS strip) through new modifications that are broadly characterized herein as being "geometric" or "degradative" in character. The present invention's "geometric" modes include "discontinuous" and "dimensional" modes of HTS strips. The "discontinuous" geometric modes of HTS strips include "apertural" modes and "depressional" modes of HTS strips.

Whether an HTS strip is conventional or inventive, the HTS strip will usually describe the aforenoted three regions ("domains"), viz., two marginal regions ("lateral domains" or "near-edge domains") and one intermediate region ("medial domain" or "midsection domain"). According to typical "wide-strip" geometric modes of the present invention (such as shown herein in FIG. 4 and FIG. 5), the dimensions of the inventive HTS strip are about the same as those of a conventional HTS strip; however, in significant contrast to a conventional HTS strip, the conductibility of the midsection domain of the inventive HTS strip is reduced (e.g., minimized) through the formation of discontinuities (e.g., perforations or trenches) in the midsection domain of the inventive HTS strip. According to typical "narrow-strip" geometric modes of the present invention (such as shown herein in FIG. 3), the dimensions of the inventive HTS strip are markedly different from those of a conventional HTS strip; that is, in contrast to a conventional HTS strip, the conductibility of the midsection domain of the inventive HTS strip is reduced (e.g., minimized) through the narrowing of the midsection domain of the inventive HTS strip. According to typical "wide-strip" degradative modes of the present invention (such as shown herein in FIG. 6), the dimensions of the inventive HTS strip are about the same as those of a conventional HTS strip; however, in significant contrast to a conventional HTS strip, the conductibility of the midsection domain of the inventive HTS strip is reduced (e.g., minimized) through the material degradation of the midsection domain of the inventive HTS strip.

Thus, preferred inventive modes of HTS strips include the following: (1) an inventive dimensional geometric mode of a narrow strip line, wherein the HTS strip's width is at least about five penetration lengths, but less than about fifty penetration lengths; (2) an inventive discontinuous geometric mode of a wide strip line, wherein the width of the wide strip is two to three orders of magnitudes of the penetration depth, and wherein large apertures (e.g., holes, perforations, openings, voids, etc.) in the midsection domain (the apertures typically covering more than half of the area of the strip midsection domain) impede the current flow along the strip in its midsection domain; (3) an inventive discontinuous geometric mode involving wide strip lines, wherein the width of the wide strip is two to three orders of magnitude of the penetration depth, and wherein an array of wide depressions (e.g., trenches, grooves, furrows, channels, etc.) in the midsection domain impede the current flow along the strip in its midsection domain; (4) an inventive degradative mode involving wide strip lines, wherein material degradation (of the HTS material) of the midsection domain impedes the current flow along the strip in its midsection domain. Inventive practice is not limited to selection of just one inventive mode, as many inventive embodiments will combine elements of two or more inventive modes (e.g., midsection narrowness and/or midsection apertures and/or midsection depressions and/or midsection degradation).

The present invention's unique foundational principle is its achievement of the following functional objective: The reduction (e.g., minimization) of the contribution of the HTS strip's middle longitudinal region to the overall current conduction by the HTS strip. The present invention's geometric and material configurations result in the forcing of "most" (more than about half) of the flow of the microwave-induced current to occur in the two extreme longitudinal regions. The various modes of inventive practice, which achieve the inventive functional objective, are classified herein as "narrow" strips (wherein the midsection domain is concomitantly "narrow") or as "wide" strips (wherein the midsection domain is concomitantly "wide" and is discontinuous, e.g., perforated, trenched or degraded). In the light of the present disclosure, the ordinarily skilled artisan will be capable of practicing the present invention's HTS strip forms at a micron length scale, following standard fabrication practices such as are known in SQUID design.

The present invention's novel high temperature superconductor (HTS) strip forms, suitable for use as poles of HTS microwave filters, succeed in minimizing the nonlinear surface impedance of such HTS microwave filters, thereby extending the applicability range of such HTS microwave filters to high power emission applications. The present invention lends itself to diverse applications (including but not limited to those involving HTS microwave filter apparatus) wherein HTS material is utilized in electronic apparatus. A main advantage of the present invention's new HTS filter designs are their suitability for both receiving antennae and emitting antennae, due to a substantial reduction in their nonlinear responses. At the same time, the inventive HTS strip forms retain the advantages traditionally associated with HTS filters. The basic inventive principle underlying the inventive HTS strip forms allows ample "head-space" for inventive performance optimization. Non-HTS-based filters, such as copper-based filters that are commonly used for emit antennae applications, have their place in the world of electronics; nevertheless, HTS filters have greater potential than have traditional non-HTS filters. For a variety of applications, the present invention's HTS-based filters better realize this potential than do known HTS-based filters.

Other objects, advantages and features of this invention will become apparent from the following detailed description of the invention when considered in conjunction with the accompanying drawings.

BRIEF DESCRIPTION OF THE DRAWINGS

In order that the present invention may be clearly understood, it will now be described, by way of example, with reference to the accompanying drawings, wherein like numbers indicate the same or similar components, and wherein.

DETAILED DESCRIPTION OF THE INVENTION

Figure 1:
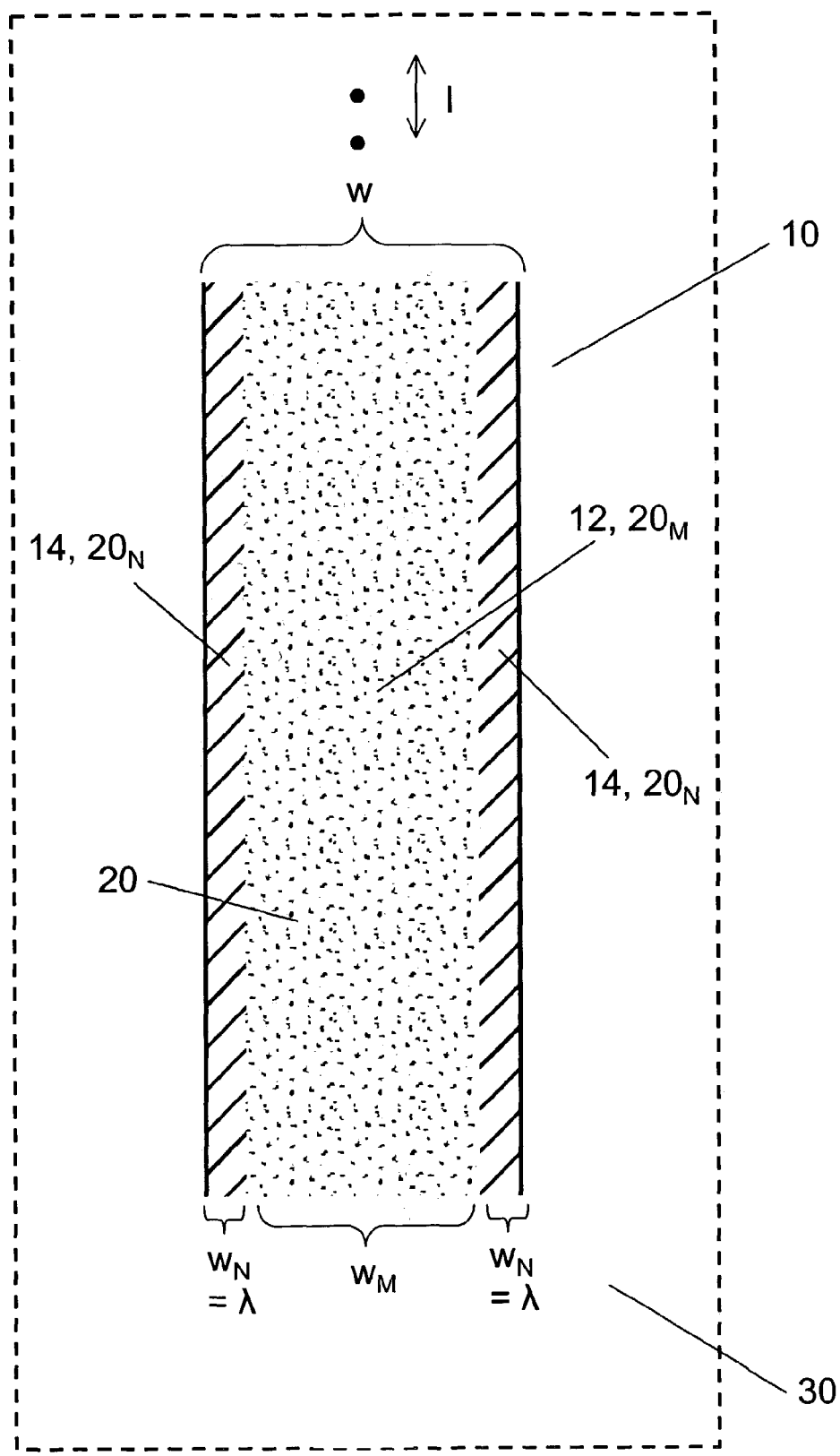
FIG. 1 is a diagrammatic plan view of a segment of a conventional "wide" HTS strip.

Referring now to FIG. 1, conventional HTS strip 10 is a "wide" strip that includes a midsection domain 12 and two near-edge domains 14. Each near-edge domain 14 is bounded on one side by a longitudinal edge 16 and on the other side by a longitudinal delineation 18. Midsection domain 12 is bounded on both sides by the two delineations 18. Each delineation 18 separates midsection domain 12 from a near-edge domain 16. The two edges 16 and the two delineations 18 are all approximately parallel. Near-edge domains 14 are each represented in FIG. 1 by a hatched area. The dotted area represents midsection domain 12. Conventional strip 10 is situated upon a substrate 30 that, according to common practice, is dielectric. The combination of substrate 30 and at least one conventional strip 10 is includable in a high temperature superconducting device such as an HTS filter.

Strip 10 is characterized by a width w and a length l. FIG. 1 is a partial view, as length l may be envisioned to extend well beyond the longitudinal ends of strip 10 as depicted. Midsection domain 12 is characterized by a width $w_M$ that is smaller than the overall width w of strip 10. Each near-edge domain 14 is characterized by a width $w_N$ that is smaller than the width $w_M$ of midsection domain 12. Thus, $w=w_M+2w_N$. HTS strip 10 has a flat (planar) upper (top) surface 20 and two longitudinal side (top-to-bottom) surfaces 22. Each edge 16 is a junction of upper surface 20 and a side surface 22. Accordingly, midsection domain 12 has an upper surface $20_M$ having width $w_M$. Each near-edge domain 14 has an upper surface $20_N$ having width $w_N$. FIG. 1 is diagrammatically idealized insofar as the edges 16 of a conventional superconductor strip 10 are shown to be perfectly straight, but in fact are rough or uneven.

Figure 2:
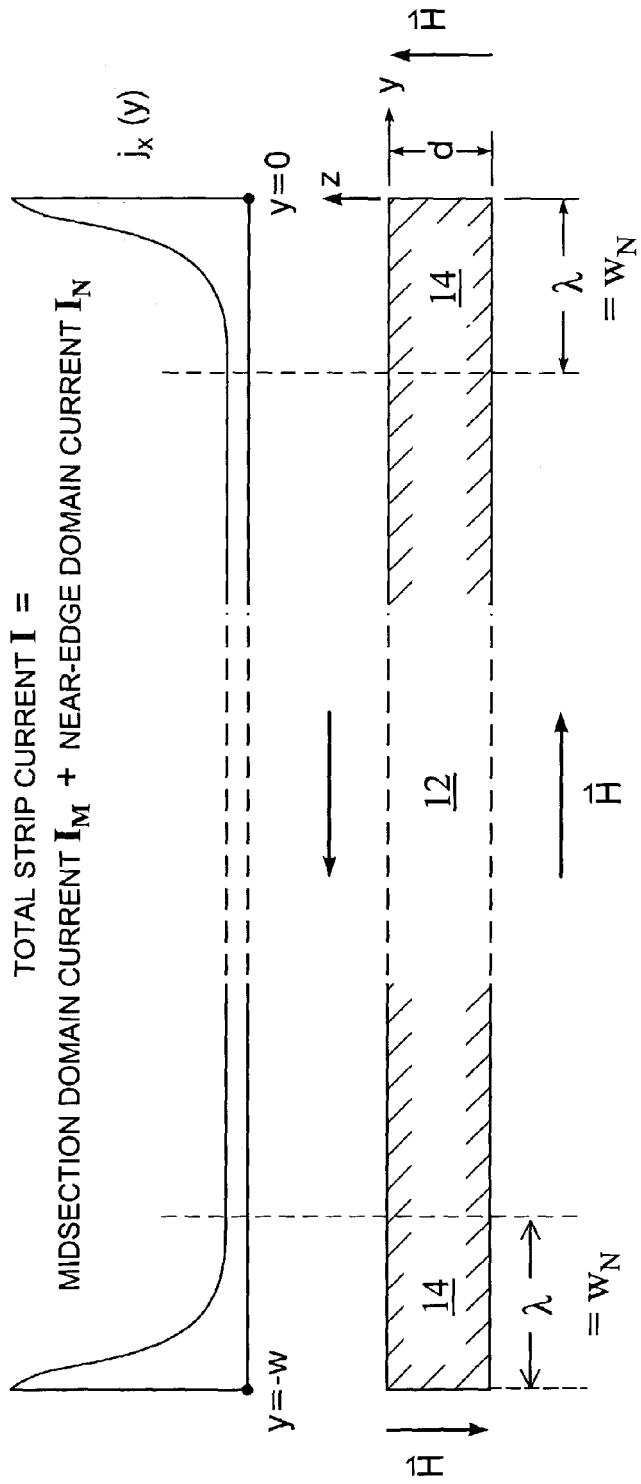
FIG. 2 is a graphical representation, coupled with a diagrammatic transverse cross-sectional elevation view of a conventional "wide" HTS strip, illustrating the current density profile $j_x(Y)$ in accordance with the width w of the HTS strip. The HTS strip's width w is very much greater than the HTS strip's thickness d.

Reference is now made to FIG. 2, which correlatively illustrates the profile of microwave current-density $j_x(Y)$ together with the widthwise cross-section (well distanced from the longitudinal ends of HTS strip 10) of a conventional wide, long HTS strip 10. As illustrated in FIG. 2, the microwave current-density profile is strongly peaked in the two near-edge domains 14, but is much lower and constant in the mid-section domain 12 as well as the associated magnetic field wrapped around strip 10. See pertinent disclosure at pages 125–131 of T. Van Duzer and C. W. Turner, *Principles of Superconductive Devices and Circuits*, Elsevier, N.Y., 1981, said book incorporated herein by reference. The two demarcation 18 lines correspond to the current-density delineations illustrated in FIG. 2. The current-density peaks at the near-edge domains 14 extend over a penetration depth λ, which typically is orders of magnitude smaller than the width w of strip 10. That is, each near-edge domain 14 of strip 10 has a width $w_N$ that approximately equals the penetration depth λ of strip 10. Thus, $w \doteq w_M+2\lambda$, since $\lambda \doteq w_N$. An approximative equivalence in width $w_N$ of both near-edge domains 14 is inferred from the symmetrical current-density profile shown FIG. 2.

The magnetic field H wraps around strip 10 such that, at the midsection domain 12 and the two near-edge domains 14, the magnetic field H is both parallel and perpendicular to the longitudinal top-to-bottom surfaces 22 of strip 10. These current and field distributions clearly indicate the existence of two physically distinct domain genres, viz., (i) the midsection domain 12 and (ii) the pair of near-edge domains 14. Midsection domain 12 is characterized by an almost constant, small current-density $j_x(y)$, and is further characterized by a magnetic field H that is aligned approximately parallel to the surface 20 of strip 10. The two near-edge domains 14 are where the current density $j_x(y)$ and its spatial gradient are high, while the magnetic field H is aligned approximately perpendicular to the surface 20 of strip 10. In a wide strip 10—i.e., wherein w>>λ—the area of midsection domain 12 is significantly larger than the area in total of the two near-edge domains 14.

At the midsection domain 12 of strip 10 the configuration of current density $j_x(y)$ together with magnetic field H conforms with an infinite, perfectly flat superconductor in the presence of a transversal field. See pertinent disclosure in Section 39 of A. Abrikosov, L. Gorkov and I. Dzyaloshinski, *Methods of Quantum Field Theory in Statistical Physics*, Dover Publications, Inc., New York, 1963, said book incorporated herein by reference. As noted hereinabove, the condensate state in midsection domain 12 yields a "large" nonlinear response. On the other hand, at the near-edge domains 14 the physics is dominated by the large current-density values and gradients. In this case, the paired-electrons current is particularly affected by the Lorentz force, which is largest at the edges, since the Lorentz force is proportional to the (vector) product of the current and magnetic field, whereas the magnetic field is proportional to the current (curl) derivative by virtue of the second London equation. See pertinent disclosure in Section 39 of the aforementioned book Abrikosov et al., *Methods of Quantum Field Theory in Statistical Physics*, Dover Publications, Inc., New York, 1963. The ensuing response is manifestly nonlinear. See the aforementioned paper included herein as Appendix A, coauthored by the present inventor and D. E. Oates and as yet unpublished by the *Journal of Superconductivity*.

The frequency dependencies and magnitudes of these two nonlinearity contributions are qualitatively and quantitatively distinct. For a wide strip 10, the intrinsic contribution associated with midsection domain 12 is "large" and practically independent of frequency f. See the aforementioned paper included herein as Appendix A, viz., Y. D. Agassi et al., in press for publication in 2003 by the *Journal of Superconductivity*. In contradistinction, the Lorentz force contribution associated with the near-edge domains 14 is "small" and proportional to 1/f. Based on this analysis, the present invention seeks to minimize the intrinsic "large" contribution of midsection domain 12 to the aggregate nonlinearity, thereby maximizing the Lorenz force-related "small" contribution of the two near-edge domains 14 to the aggregate nonlinearity. The present invention uniquely accomplishes this minimization of the cumulative nonlinearity by providing various embodiments of inventive HTS strip 100, which represent new HTS strip forms in terms of geometry and/or materiality.

With reference to FIG. 3 through FIG. 7, the present invention takes advantage of the scientific principles discussed hereinabove in connection with FIG. 2. The inventive HTS strips 100 shown in FIG. 3 through FIG. 7 each parallel the conventional strip 10 shown in FIG. 1 insofar as being characterized by "regionalization." Each inventive strip 100 embodiment includes a midsection domain 112 and two near-edge domains 114. Each near-edge domain 114 is bounded on one side by a longitudinal edge 116 and on the other side by a longitudinal delineation 118. Midsection domain 112 is bounded on both sides by the two delineations 118. Midsection domain 112 is bounded on both sides by the two delineations 118. Each delineation 118 separates midsection domain 112 from a near-edge domain 116. The two edges 116 and the two delineations 118 are all approximately parallel. Inventive HTS strip 100 has an upper surface 120 and two longitudinal side (top-to-bottom) surfaces 122. According to most inventive embodiments, upper surface 120 essentially describes an imaginary geometric plane, albeit inventive practice is variable in terms of continuity or discontinuity of upper surface 120. Similarly as conventional strip 10 is depicted in FIG. 1, inventive strip 100 is situated upon a substrate 30; in inventive practice, substrate 30 will typically be dielectric, but need not be, depending on the embodiment. The combination of substrate 30 and at least one strip 10 is includable in a high temperature superconducting device such as an HTS filter. FIG. 3 through FIG. 7 are diagrammatically idealized insofar as the edges 116 of an inventive superconductor strip 100 are shown to be perfectly straight, but in fact are rough or uneven.

Because inventive strip 100 and conventional strip 10 are analogous in some respects, the same reference characters are used herein for strip dimensions. Inventive strip 100 is characterized by a width w and a length l. FIG. 3 through FIG. 7 are partial views, as in each said figure length l may be envisioned to extend well beyond the longitudinal ends of inventive strip 100 as shown. Midsection domain 12 is characterized by a width $w_M$ (which is smaller than the overall width w of inventive strip 100), and each near-edge domain 114 is characterized by a width $w_N$ (which is smaller than the overall width w of inventive strip 100); therefore, $w = w_M + 2w_N$. Each edge 116 is a junction of upper surface 120 and a side surface 122. Accordingly, midsection domain 112 has an upper surface $120_M$ having width $w_M$. Each near-edge domain 114 has an upper surface $120_N$ having width $w_N$. Similarly as shown for conventional strip 10 in FIG. 1, the near-edge domains 114 of inventive strip 100 are each represented by a hatched area, and the midsection domain 112 of inventive 100 is represented in FIG. 3 through FIG. 7 by either of two kinds of dotted areas.

Figure 4:
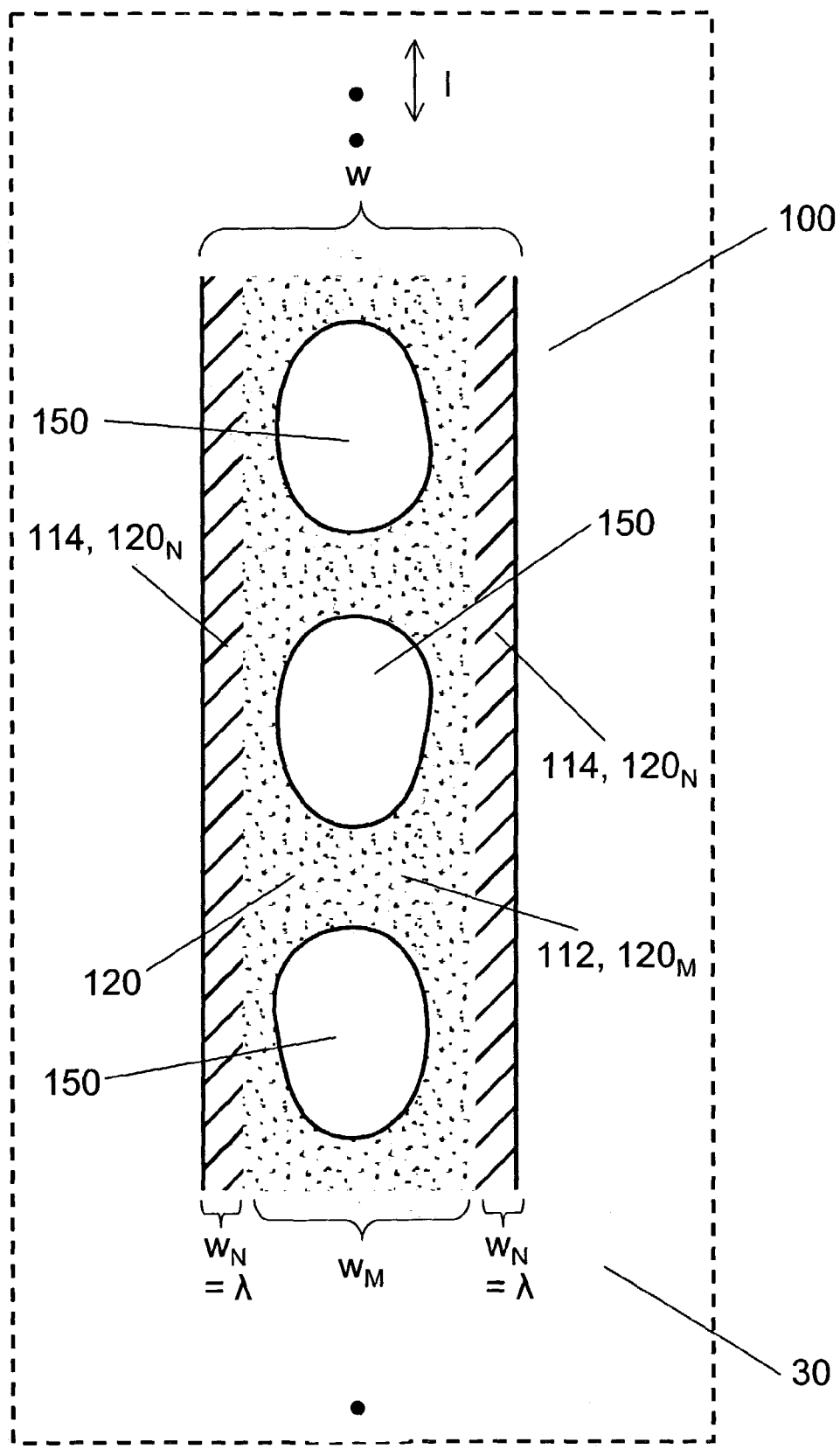
FIG. 4 is a diagrammatic plan view of a segment of an inventive "wide" HTS strip characterized by apertures located in the midsection domain of the HTS strip.
Figure 5:
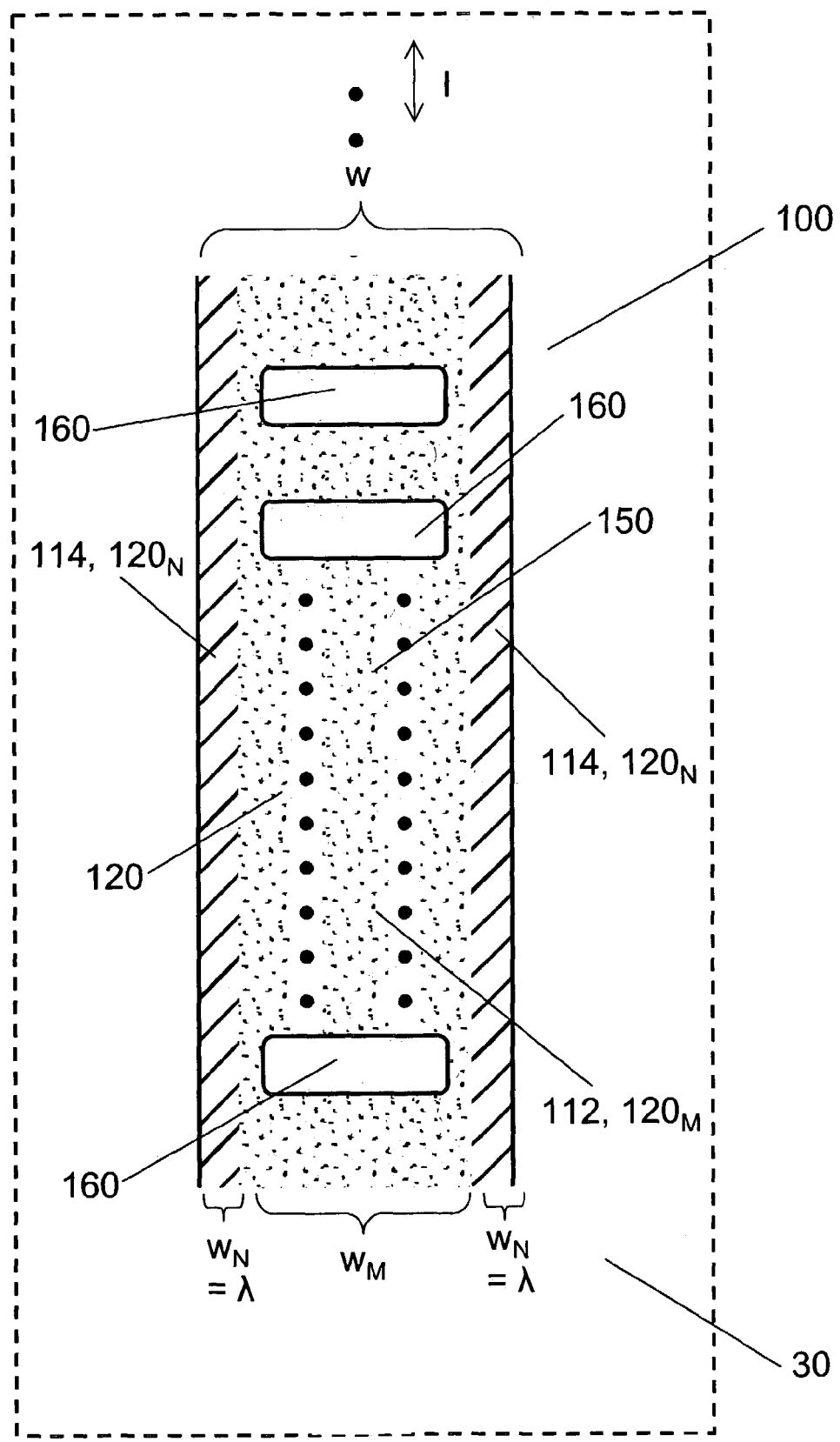
FIG. 5 is a diagrammatic plan view of a segment of an inventive "wide" HTS strip characterized by depressions located in the midsection domain of the HTS strip.
Figure 7:
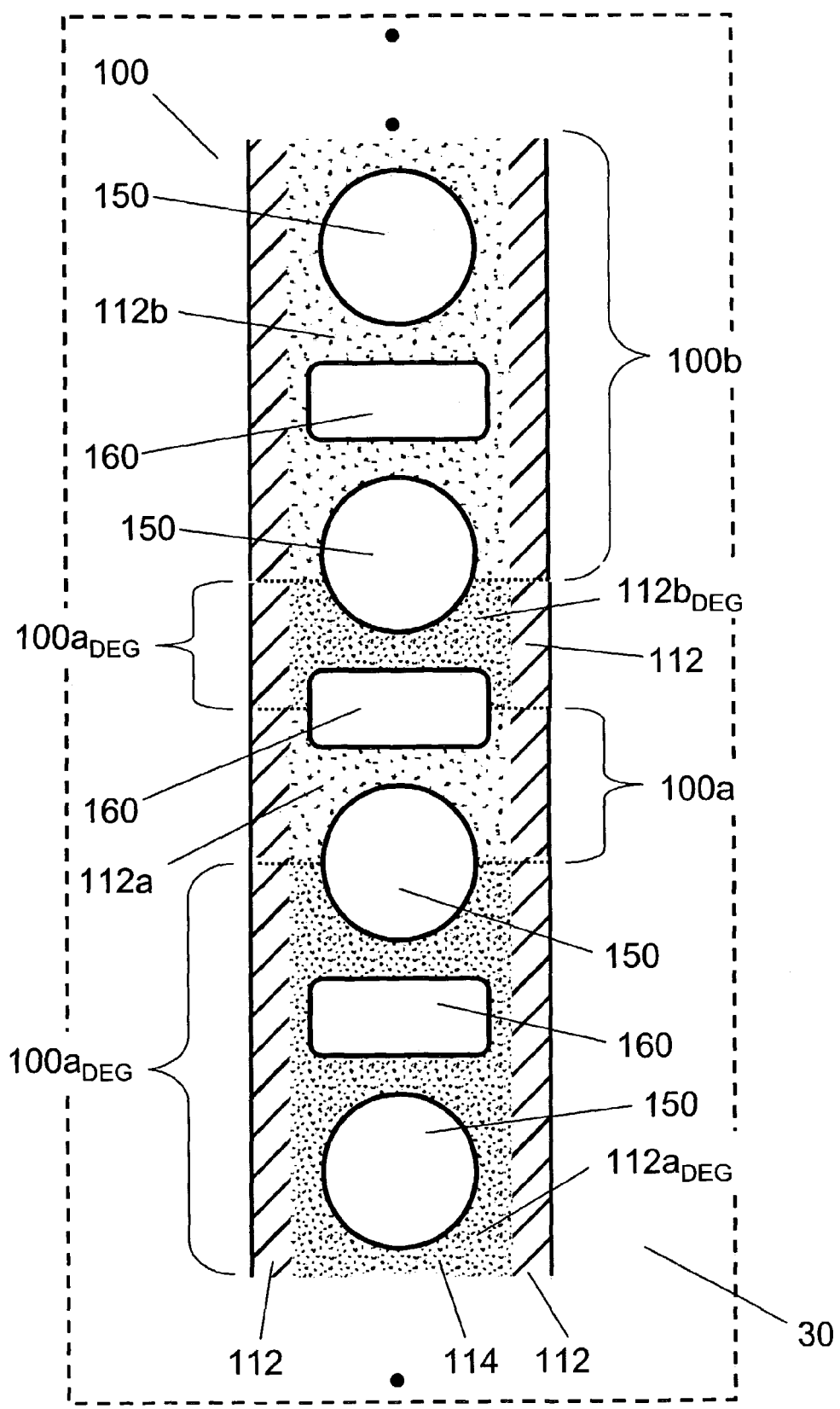
FIG. 7 is a diagrammatic plan view of a segment of an inventive "wide" HTS strip characterized by a combination or "conglomeration" of inventive features (including apertures, depressions and material degradation) existing in the midsection domain of the HTS strip.

With particular reference to FIG. 4, FIG. 5 and FIG. 7, inventive strip 100 comprises superconductive material (e.g., high temperature superconductor material) and is divisible into two lateral domains 114 and a medial domain 112 therebetween. Inventive strip 100 is capable of conducting an amount of current that at least substantially consists of an amount of current conducted by lateral domains 114 and an amount of current conducted by medial domain 112. Medial domain 112 is discontinuous so that medial domain 112, and hence inventive strip 100, comprises a lesser amount of superconductive material than if medial domain 112 were continuous. Inventive strip 100 is thereby characterized by a greater proportion of conduction by the lateral domains 114 than if the medial domain 112 were continuous. In inventive practice in general, it may be preferable, depending on the inventive embodiment, to provide for more than half of the current being conducted by lateral domains 114; however, this condition is not necessary to inventive practice and is not present in some inventive embodiments.

As illustrated in FIG. 4, FIG. 5 and FIG. 7, the discontinuity of medial domain 112 is manifested as at least one of the following properties: (i) a plurality of apertures in the inventive strip's medial domain, such as shown in FIG. 4; and/or, (ii) a plurality of depressions in the inventive strip's medial domain, such as shown in FIG. 5; and/or, (iii) a plurality of insulative locations in the inventive strip's medial domain, such as shown in FIG. 7. A combination of these properties is represented in FIG. 7. Inventive strip 100 is characterized by nonlinearity that is a function of the amount of current conducted by inventive strip 100. Lateral domains 114 are characterized by "weak" nonlinearity that is less magnitudinous that which characterizes medial domain 112. Medial domain 112 is characterized by "strong" nonlinearity that is more magnitudinous than that which characterizes lateral domains 114. Strip 100 is thereby characterized by a greater proportion of the weak linearity than if medial domain 112 were continuous.

Figure 3:
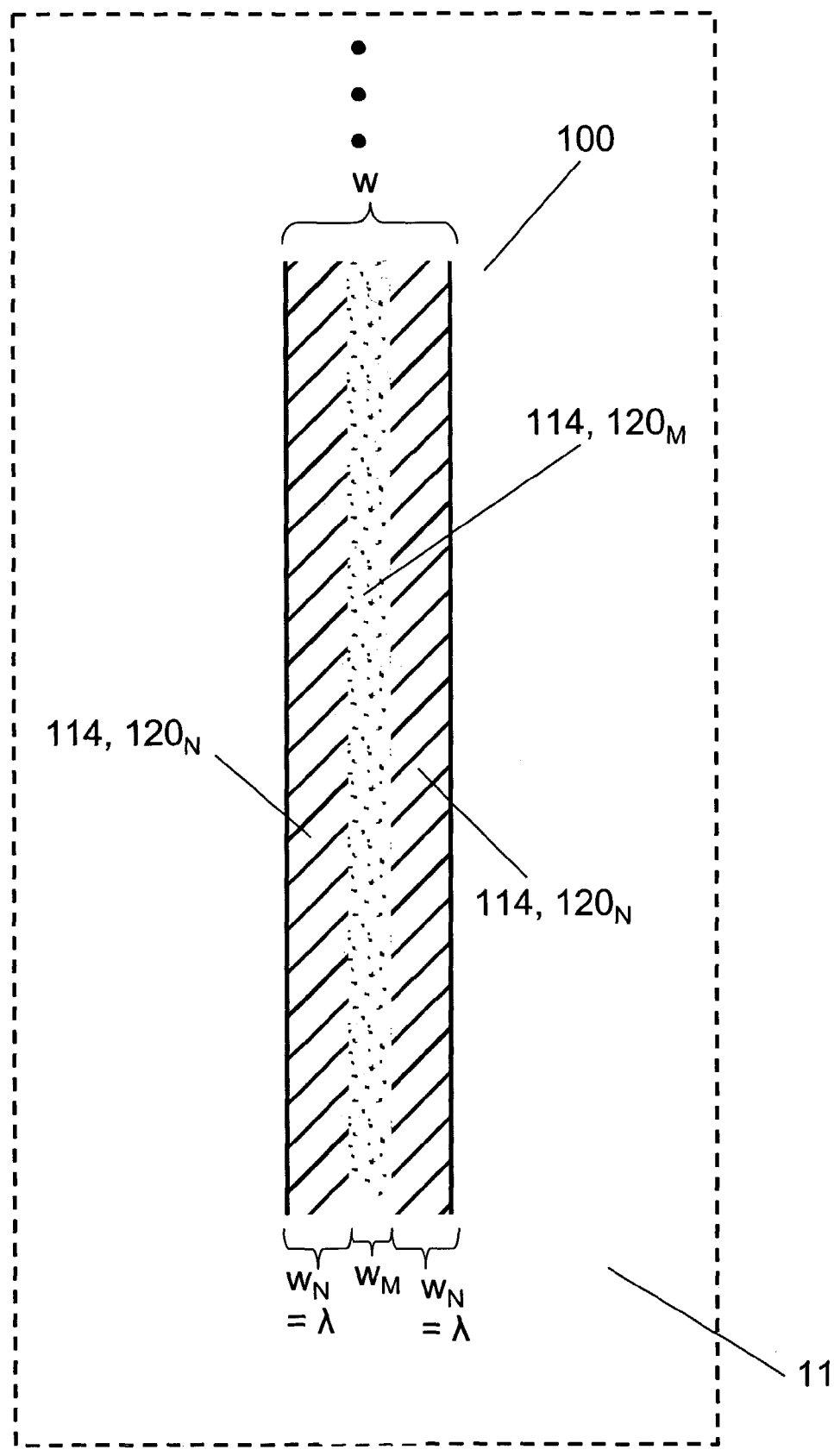
FIG. 3 is a diagrammatic plan view of a segment of an inventive "narrow" HTS strip.

Like conventional strip 10 shown in FIG. 1, the inventive strips 100 shown in FIG. 4, FIG. 5, FIG. 6 and FIG. 7 are "wide" HTS strips, in which the widths $w_N$ of near-edge domains 114 are considerably smaller than the width $w_M$ of midsection domain 112. The width w of a "wide" HTS strip, whether a conventional strip 10 or an inventive strip 100, is such that the ratio of width w to penetration depth $\lambda$ is at least about two hundred; that is, $w/\lambda \geq 200$. In contrast, inventive strip 100 shown in FIG. 3 is an inventively "narrow" HTS strip. As shown in FIG. 3, each width $w_N$ of a near-edge domain 114 is larger than the width $w_M$ of midsection domain 112. Inventively "narrow" HTS strip 100 replaces traditional strip "wideness" with inventive strip "narrowness."

An inventively "narrow" strip 100 is such that the ratio of width w to penetration depth $\lambda$ falls within the range between about five and about fifty; that is, $5 \leq w/\lambda \leq 50$. In inventively "narrow" strips 100, the "large" nonlinear contribution by midsection domain 112 is drastically reduced, leaving a drastically increased "small" nonlinear contribution by the two near-edge domains 114. The present invention establishes this preferred $w/\lambda$ value range of approximately 5 to 50 because it covers a desired "middle ground" between $w/\lambda$ values that are too low and $w/\lambda$ values that are too high. If $w/\lambda$ is too small (i.e., below 5, e.g., in the 2–3 range) or too large (i.e., above 50, e.g., in the 70–80 range), the near-edge domains' current density peaks will merge, to a considerable extent, into an approximately uniform charge distribution, thus essentially leaving a situation akin to that of a conventional "wide" strip 10 (which is characterized by a uniform current distribution).

The uneven topographies of the inventive strips 100 shown in FIG. 4 and FIG. 5 significantly differ from the even topography of the conventional strip 10 shown in FIG. 1. An inventive HTS strip 100 having a "wide" width dimension (i.e., wherein $w/\lambda \geq 200$) may be easier to fabricate than would an inventive HTS strip 100 having a "narrow" width dimension (i.e., wherein $5 \leq w/\lambda \leq 50$). The midsection domain 112 shown in FIG. 4 is provided with large holes 150. The midsection domain 112 shown in FIG. 5 is provided with trenches 160. According to either of these inventively "discontinuous" configurations, the electromagnetic current will primarily flow along the near-edges 114 of inventive strip 100. Similarly, the electromagnetic current will primarily flow along the near-edges 114 of "degradative" inventive strip 100 shown in FIG. 6 and "conglomerative" inventive strip 100 shown in FIG. 7.

Various approaches can be taken to making inventive strips 100. In the light of the instant disclosure, the ordinarily skilled artisan will be capable of making inventive strips 100. The fabrication of inventive geometries such as shown in FIG. 3 through FIG. 5 can be achieved using standard techniques such as ion-milling patterning that is routinely practiced in SQUID design. According to the ion-milling patterning technique that is known in SQUID-related applications, holes of various geometries ("antidots") and narrow line shapes are introduced for different physical reasons. See pertinent disclosure by: S. J. Kim, Yu I. Latyshev, T. Yamashita and S. Kishida, *Physica C* 362, 150 (2001); A. S. Katz, S. I. Wood and R. C. Dynes, *Jour. of App. Phys.* 87, 2978 (2000); D. Koelle et al., *Rev. Mod. Phys.* 71, 631

(1999); G. Benz, S. Wunsch, T. A. Scherer, M. Neuhaus and W. Jutzi, *Physica C* 356, 122 (2001). Other pertinent references are disclosed in the aforementioned SQUID review article D. Koelle et al., *Rev. Mod. Phys.* 71, 631 (1999).

The above-noted ion milling technique can be used to manufacture, from scratch, "narrow" geometrically inventive strips 100 (such as shown in FIG. 3) as well as "wide" geometrically inventive strips 100 (such as shown in FIG. 4 and FIG. 5). According to inventive methods of fabricating inventive strips 100 in a single operation, HTS material is deposited as a thin film upon substrate 30. In so doing, an "etching" technique or a "stenciling" technique can be inventively effectuated. According to an "etching" technique, the inventive strip 100 geometries are etched in the initially deposited HTS material situated on substrate 30. According to a "stenciling" technique, substrate 10 is initially covered with a sheet or mask so that when HTS material is deposited on substrate 30, the desired inventive strip 100 geometries are reproduced in the HTS film beneath the sheet or mask.

Figure 6:
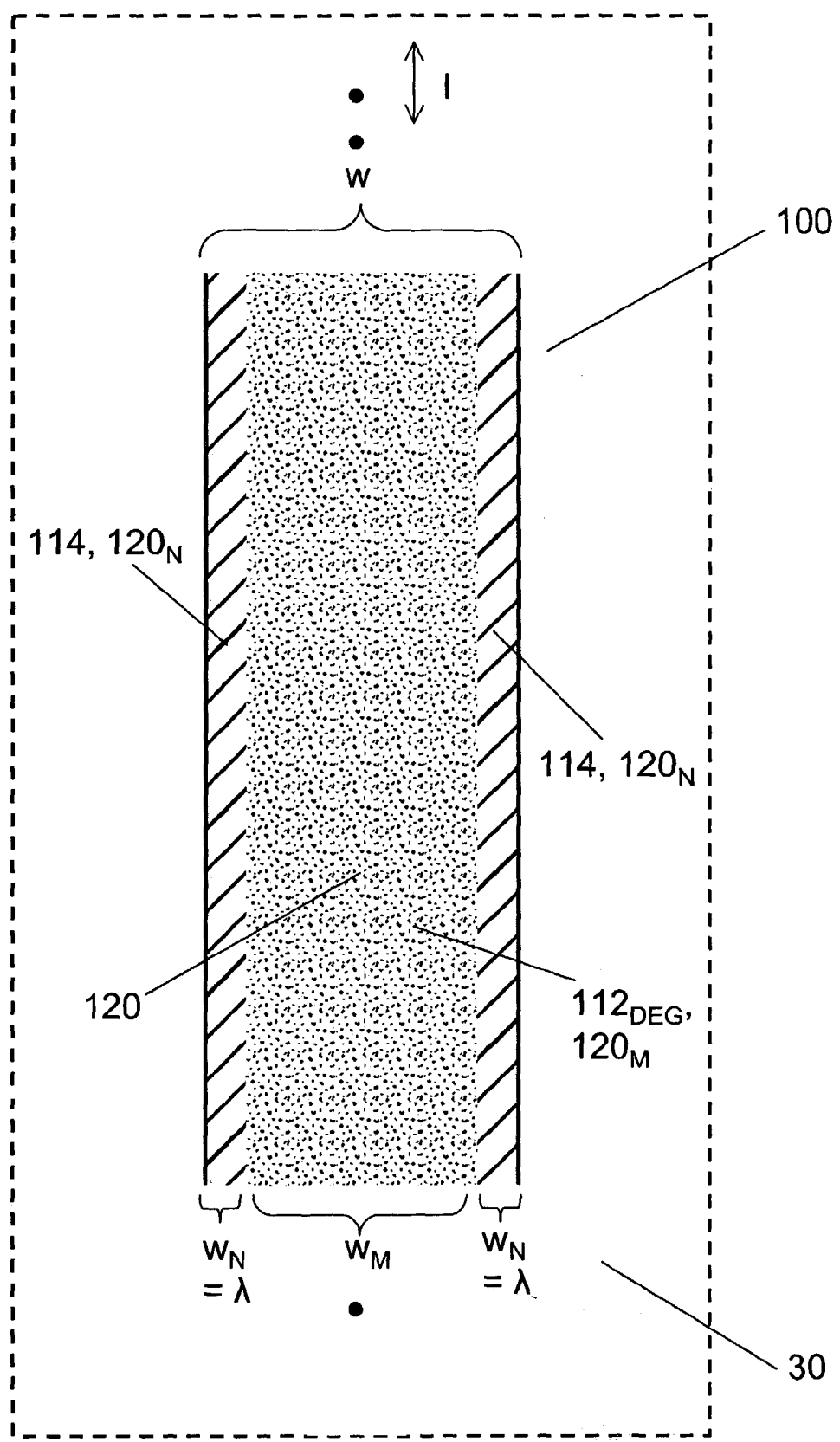
FIG. 6 is a diagrammatic plan view of a segment of an inventive "wide" HTS strip characterized by material degradation in the midsection domain of the HTS strip.

Alternatively, inventive "wide" strips 100 can be made via modification of a conventional "wide" strip, such as strip 10, that has previously been disposed on a substrate 30 such as shown in FIG. 1. In practicing "wide" strips 100 in accordance with the present invention, the conventional strips 10 already produced can be inventively modified so as to become one of the following: an aperturally discontinuous inventive embodiment 100 such as shown in FIG. 4; or, a depressionally discontinuous inventive embodiment 100 such as shown in FIG. 5; or, a degradative inventive embodiment 100 such as shown in FIG. 6; or, some combination thereof, such as shown in FIG. 7. Production of an apertural inventive embodiment 100 can involve, for example, the perforating of the HTS film in midsection 12 with an array of holes 150, thereby converting the midsection 12 HTS film into a midsection 112 apertured HTS film such as shown in FIG. 4. Production of a depressional inventive embodiment 100 can involve, for example, the impressing of the HTS film in midsection 12 with an array of trenches 160, thereby converting the midsection 12 HTS film into a midsection 112 trenched HTS film such as shown in shown in FIG. 5. Production of a degradative inventive embodiment 100 can involve, for example, the degrading of the HTS film in midsection 12 by locally heating the HTS film in midsection 12 through application of a strong focused electron beam that will deoxygenate the HTS material, thereby converting the midsection 12 HTS film into a midsection 112 insulating oxide film such as shown in FIG. 6. Production of a combinative embodiment such as shown in FIG. 7 can involve a combination of these techniques.

Midsection 12 shown in FIG. 1, midsection 112 shown in FIG. 3, and the areas of midsection 112 other than the inventive apertures 150 shown in FIG. 4 and the inventive depressions 160 shown in FIG. 5, are each demarcated by a coarser, less concentrated dot pattern, indicating a "non-degraded" HTS material. In contrast, midsection domain $112_{DEG}$ shown in FIG. 6 is demarcated by a finer, more concentrated dot pattern, indicating an inventively "degraded" material, which is an insulating oxide material rather than an HTS material. The inventive tape 100 embodiment shown in FIG. 7 features apertures 150, depressions 160 and degraded midsection domain sections $112a_{DEG}$ and $112b_{DEG}$. Degraded tape sections $100a_{DEG}$ and $100b_{DEG}$ (which include degraded midsection domain sections $112a_{DEG}$ and $112b_{DEG}$, respectively) alternate longitudinally with non-degraded tape sections 100a and 100b (which include non-degraded midsection domain sections 112a and 112b, respectively). Although these inventive features are shown in FIG. 7 in the context of an inventive "wide" strip 100 embodiment, they can be inventively practiced in association with inventive strips 100 of varying widths w, including inventively "narrow" widths w, or widths w that are wider than inventive "narrow" widths w but narrower than "wide" widths w, or widths w that are narrower than inventive "narrow" widths w.

The nonlinearity associated with the midsection domain of a conventional strip (such as conventional strip 10 that shown in FIG. 1) is "large" and is practically frequency-independent; by comparison, other sources for nonlinearity, such as vortex in-out motion, are documented to be much smaller. See pertinent disclosure by the aforementioned D. E. Oates et al., *Physica C* 372–376, 462 (2002). Accordingly, the observed large nonlinearity of a conventional strip derives from the large width w of the conventional strip, this large width w typically falling in the range between about $100\mu$ and about $150\mu$. Penetration depth $\lambda$ is typically two to three orders of magnitude smaller than this large width w. See the aforementioned paper, included herein as Appendix A, coauthored by the present inventor and D. E. Oates and in press for publication in 2003 by the *Journal of Superconductivity*.

According to the present invention's novel concept, it follows that nonlinearity reduction (e.g., minimization) is expected to reside in an HTS strip configuration that reduces (e.g., minimizes) the proportional midsection domain contribution. The present invention uniquely accomplishes reduction/minimization of the contribution by the midsection domain to the overall conduction along the strip—and hence uniquely accomplishes reduction/minimization of the nonlinearity of the strip—by forcing the microwave current to disproportionately flow along the two near-edge domains, where nonlinearity is considerably smaller. The inventive HTS strip 100 forms shown in FIG. 3 through FIG. 7 are examples of inventive embodiments that achieve this inventive goal.

The term "strip," as used herein, refers to any conductor (e.g., superconductor) strip that is characterized by a uniform width. In terms of its geometric outline, an inventive strip can be rectilinear, curvilinear or some combination thereof, so long as it at least substantially, essentially or generally has a uniform width. FIG. 3 through FIG. 7 show segments of inventive superconductor strips that are straight but that are readily envisioned as curved. Nor is it necessary that a "strip," as used herein, be characterized by a single imaginary axis of symmetry between its two edges that describe a uniform width. "I"-shaped, "T"-shaped, "L"-shaped, "U-shaped and various other outline geometries of a conductor strip are possible in inventive practice.

As conventionally understood, high temperature superconductor (HTS) materials are materials that exhibit superconductivity at temperatures over 24K (i.e., superconducting transition temperature $T_c>24K$), whereas low temperature superconductor (LTS) materials are materials that exhibit superconductivity at temperatures no higher than 24 K (i.e., superconducting transition temperature $T_c \leq 24K$). Currently, there are HTS materials having a $T_c$ temperature as high as about 133K, and higher $T_c$ temperatures are expected in the future. Although HTS superconductivity is emphasized herein, the present invention admits of practice using any and all superconductor materials, including HTS materials, LTS materials, and superconductor materials having $T_c$ temperatures therebetween. Notable in the intermediate $T_c$ temperature category (neither HTS nor LTS) is magnesium diboride (MgB2), which has a a $T_c$ temperature of about 39.5K.

Figure 8:
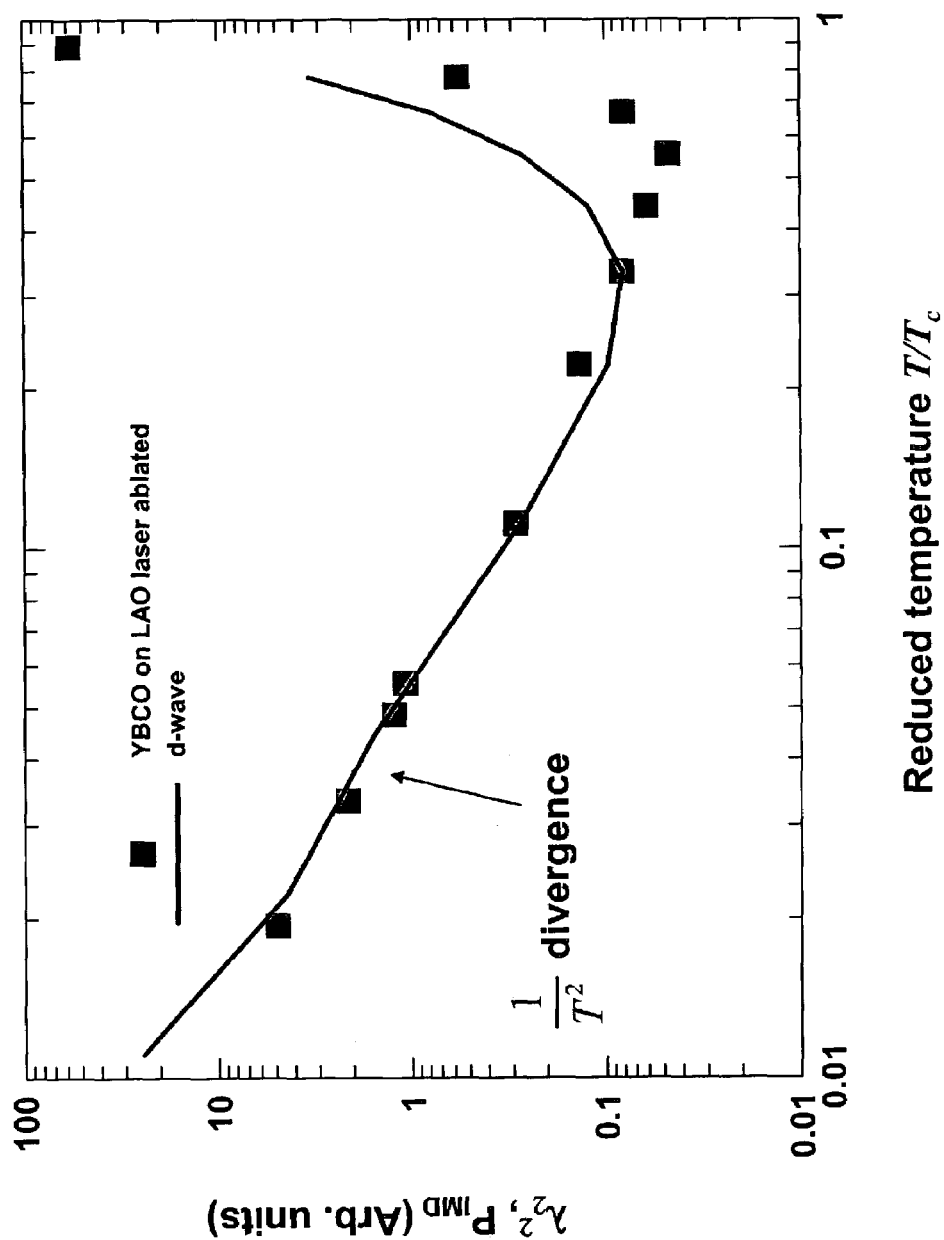
FIG. 8 is a graph comparing calculation (using equation (1), hereinbelow) and data for the lowest nonlinear correction to the penetration depth.

With reference to FIG. 8, the present inventor discloses additional verification that intrinsic nonlinearity predominates in a superconductor strip, in his unpublished paper (coauthored with D. E. Oates) entitled "Non Linear Surface Reactance of YBCO in the Presence of a Strong Microwave Radiation Field," submitted on or about March 2003 to *Physica C* for publication, and substantively presented at the Seventh International Conference on Materials and Mechanisms of Superconductivity and High Temperature Superconductors, May 25–30, 2003, Rio de Janeiro, Brazil. At this conference in Brazil the present inventor presented a poster, incorporated herein by reference, relating to his unpublished paper.

The data illustrated in FIG. 8 compares favorably in trend and in magnitude with the theoretical model that is proposed and calculated as described hereinbelow. The data relates to YBCO film that was grown on an MgO substrate via pulsed laser deposition. The basics of the experimental procedure are disclosed by the aforementioned D. E. Oates et al., *Physica C* 372–376, 462 (2002). The YBCO film (having an undulating strip configuration of approximate width 150 $\mu$m, approximate thickness 350 nm and approximate length 2 cm) was placed in a microwave stripline resonator cavity, and the experiments were performed at frequency f=2.2 GHz. The nonlinear surface impedance was extracted through measurement of the shift and broadening of the cavity resonance frequency or the intermodulation products power.

Still referring to FIG. 8, the nonlinear surface reactance of a d-wave superconductor is calculated through effectuation of a microscopic approach that is based on a perturbative expansion in the field strength, and is compared to the optimally-doped YBCO film data. The data is analyzed in terms of the two fluid model expressions wherein the reactance in particular is proportional to the penetration depth. The reactance is fitted in terms of an expansion in even powers of the microwave current density j. Therefore, the lowest nonlinear contribution to the reactance is $\lambda_2 j^2$. The objects of the calculation are the extracted coefficients $\lambda_2$. The nonlinear response of the condensate state to a transversal electromagnetic field is carried out in the framework of a microscopic approach. Starting from the perturbative expansion of the green function in the electromagnetic field, the $\lambda_2$ coefficient is extracted from the third order term. This differs from a previous analysis, which was based on the Yip-Saul approximation. The calculation is facilitated by consideration only of the static long wavelength limit, consistent with the observed weak frequency dependence. This approach is advantageous in that the result does not invoke free parameters, thus providing a stringent test of the basic premise. The order parameter d-wave symmetry is an essential part of this analysis. The derived expression for $\lambda_2$ in cgs units is $$\lambda_2(T) = -\frac{8e^4 \lambda_0^5(T) d^2 a \mu^2}{m_{ab} c^6 \hbar^2 \beta a_c \Delta_0^3(T)} *$$

$$\sum_n \int_0^{2\pi} d\theta \cos^4(\theta) \cos^2(2\theta) \frac{\cos^2(2\theta) - 4(\hbar\omega_n/\Delta_0(T))^2}{(\cos^2(2\theta) + (\hbar\omega_n/\Delta_0(T))^2)^{7/2}} \quad (1)$$

In equation (1), above: T is the temperature; e is the electron charge; $\lambda_0(T)$ is the (linear) penetration depth; d is the strip thickness; $\alpha$ is a dimensionless approximation-related parameter $\alpha$ 10; $\mu$ is the Fermi energy; $m_{ab}$ is the effective mass in the ab plane; $\beta = (k_B T)^{-1}$ where $k_B$ is the Boltzmann constant; $\alpha_c$ is the lattice constant in the c-axis direction; the d-wave gap is $\Delta(T,\theta) = \Delta_0(T)\cos(2\theta)$ where $\theta$ is the azimuth cylindrical-coordinates angle; $\omega_n = (2n+1)\pi/(\beta\hbar)$ is the Matsubara frequency where the summation in the above equation over n covers all integers n.

FIG. 8' illustrates a comparison of the calculated results and the experimental results. The parameters employed are $\alpha = 10$, $\Delta_0(T=0)/(k_B T) = 3$, $\mu/\Delta_0(T=0) = 25$, $\alpha_c = 1.1$ mm, $\lambda_0(T) = \lambda^0/\sqrt{1-(T/T_C)^2}$ with $\lambda_0 = 200$ nm[7] and $\Delta_0(T) = \Delta_0 \sqrt{(1-(T/T_C)^2)}$ [12] with $\Delta_0 = 0.024$ eV. With the exception of $\alpha$, these parameters are standard with no attempted adjustments. The results compare well with the data both qualitatively and absolutely. The upturn at low temperatures (approximately as 1/T) has been predicted and is characteristic of a d-wave order parameter symmetry. At higher temperatures, thermal excitations overshadow the effects of the d-wave nodes, resulting in a dramatic decrease of the difference between the results for an s-wave and d-wave order parameter symmetry. Based on this comparison between calculation and experimental data, the proposition is strengthened that the observed nonlinearity existing in a superconductor strip is predominantly an intrinsic effect. The good agreement of the calculation with the data suggests that the observed nonlinearity is intrinsic. Additional substantiation of this proposition can be sought in an analogous manner involving explanation of the observed dependence of $\lambda_2$ on factors such as doping.

Other embodiments of the present invention will be apparent to those skilled in the art from a consideration of this specification or practice of the present invention disclosed herein. Various omissions, modifications and changes to the principles described herein may be made by one skilled in the art without departing from the true scope and spirit of the present invention, which is indicated by the following claims.

What is claimed is:

1. A superconductor strip suitable for situation upon a substrate, said strip comprising superconductor material and having three domains, said domains being a pair of lateral domains and a medial domain, said medial domain being intermediate said lateral domains, wherein when said strip conducts current more than fifty percent of the current conducted by said strip is conducted by said lateral domains, the amount of current conducted by said strip being the sum of said current conducted by said medial domain and said current conducted by said lateral domains.

2. The superconductor strip defined in claim 1, said strip having associated therewith a strip nonlinearity, said medial domain having associated therewith a medial nonlinearity, said lateral domains having associated therewith a lateral nonlinearity, said medial nonlinearity being greater than said lateral nonlinearity, said strip nonlinearity being the sum of said medial nonlinearity and said lateral nonlinearity, wherein said strip nonlinearity varies in accordance with the proportions, with respect to said conducting of said current by said strip, of said conducting by said medial domain and said conducting by said lateral domain.

3. The superconductor strip defined in claim 1, said strip being characterized by a strip width, said medial domain being characterized by a medial width, each said lateral domain being characterized by a lateral width, said strip width being the sum of said medial width and said lateral widths, each said lateral width approximately equaling the penetration depth of said strip.

4. The superconductor strip defined in claim 3, wherein the ratio of said strip width to said penetration depth is in the range between approximately five and approximately fifty.

5. The superconductor strip defined in claim 1, said medial domain having plural apertures disposed therein, said medial domain thereby being capable of conducting less current than said medial domain would be capable of conducting in the absence of said apertures.

6. The superconductor strip defined in claim 1, said medial domain having plural depressions disposed therein, said medial domain thereby being capable of conducting less current than said medial domain would be capable of conducting in the absence of said depressions.

7. The superconductor strip defined in claim 1, said medial domain being characterized by degradation of said superconductor material that is included in said medial domain, said medial domain thereby being capable of conducting less current than said medial domain would be capable of conducting in the absence of said degradation.

8. The superconductor strip defined in claim 7, said degradation having been effected by the method including applying heat to deoxygenate said superconductor material that is included in said medial domain, said superconductor material that is included in said medial domain thereby at least substantially becoming an insulating oxide material.

9. The superconductor strip defined in claim 1, said medial domain being attributed with at least one element that reduces the conductivity of said medial domain as compared with the conductivity of said medial domain in the absence of said at least one element, said at least one element being selected from the group consisting of the following elements:
the presence of plural apertures in said medial domain;
the presence of plural depressions in said medial domain;
the presence of insulating oxide material in said medial domain.

10. The superconductor strip defined in claim 9, wherein the ratio of said strip width to said penetration depth is at least approximately two hundred.

11. The superconductor strip defined in claim 9, said superconductor material being high temperature superconductor material, said strip having associated therewith a strip nonlinearity, said medial domain having associated therewith a medial nonlinearity, said lateral domains having associated therewith a lateral nonlinearity, said medial nonlinearity being greater than said lateral nonlinearity, said strip nonlinearity being the sum of said medial nonlinearity and said lateral nonlinearity, wherein said strip nonlinearity varies in accordance with the proportions, with respect to said conducting of said current by said strip, of said conducting by said medial domain and said conducting by said lateral domain.

12. A strip comprising superconductive material and being divisible into two lateral domains and a medial domain therebetween, said strip being capable of conducting an amount of current that at least substantially consists of an amount of current conducted by said lateral domains and an amount of current conducted by said medial domain, said medial domain being discontinuous so that said medial domain and hence said strip comprises a lesser amount of superconductive material than if said medial domain were continuous, said strip thereby being characterized by a greater proportion of conduction by said lateral domains than if said medial domain were continuous.

13. The strip according to claim 12, said discontinuity of said medial domain being manifested as at least one of the following properties:
a plurality of apertures in said medial domain;
a plurality of depressions in said medial domain;
a plurality of insulative locations in said medial domain.

14. The strip according to claim 12, said strip being characterized by nonlinearity that is a function of the amount of current conducted by said strip, said lateral domains being characterized: by weak nonlinearity that is more magnitudinous that which characterizes said medial domain, said medial domain being characterized by strong nonlinearity that is less magnitudinous than that which characterizes said lateral domains, said strip thereby being characterized by a greater proportion of said weak linearity than if said medial domain were continuous.

15. The strip according to claim 14, said superconductor material including high temperature superconductor material.

16. A method for reducing the nonlinearity associated with a superconductor strip placed on a substrate, said superconductor strip being at least substantially composed of a superconductor material, said method comprising:
identifying two longitudinal lateral domains and one longitudinal medial domain into which said strip is widthwise divided, said medial domain being between said lateral domains, each said lateral domain having a width approximately equal to the penetration depth of said strip; and
modifying said medial domain so that the conductivity of said medial domain decreases, the conductivity of said lateral domains proportionately increasing relative to the overall conductivity of said strip, the overall nonlinearity of said strip commensurately decreasing.

17. The method for reducing according to claim 16, wherein said modifying of said medial domain results in said conductivity of said lateral domains being greater than one-half of said overall conductivity of said strip.

18. The method for reducing according to claim 16, wherein said modifying of said medial domain includes performing at least one of the following:
providing plural apertures in said medial domain;
providing plural depressions in said medial domain;
degrading said medial domain, said degrading including heating said medial domain so as to deoxygenate said medial domain, said degrading resulting in said medial domain being at least substantially composed of a dielectric oxide material.

19. The combination including a substrate and at least one conductive strip disposed on said substrate, wherein as to each said conductive strip:
said conductive strip includes superconductive material;
said conductive strip is characterized by two lateral domains and a medial domain therebetween;
said lateral domains at least substantially consist of superconductive material;
said lateral domains each have a width corresponding to the penetration depth of said conductive strip;
said medial domain conducts less than half of the electricity that is conducted by said conductive strip.

20. The combination as recited in claim 19, wherein said medial domain is characterized by at least one of the following:
plural apertures;
plural depressions;
material that to at least a substantial degree is not superconductive material.

* * * * *